US011584851B2

(12) United States Patent
Shi et al.

(10) Patent No.: US 11,584,851 B2
(45) Date of Patent: Feb. 21, 2023

(54) RESIN COMPOSITION, AND PREPREG AND CIRCUIT MATERIAL USING THE SAME

(71) Applicant: Shengyi Technology Co., Ltd., Guandong (CN)

(72) Inventors: Jianying Shi, Guangdong (CN); Weifeng Yin, Guangdong (CN); Yongjing Xu, Guangdong (CN); Shanyin Yan, Guangdong (CN)

(73) Assignee: Shengyi Technology Co., Ltd., Guandong (CN)

( * ) Notice: Subject to any disclaimer, the term of this patent is extended or adjusted under 35 U.S.C. 154(b) by 117 days.

(21) Appl. No.: 17/160,011

(22) Filed: Jan. 27, 2021

(65) Prior Publication Data

US 2021/0301130 A1 Sep. 30, 2021

(30) Foreign Application Priority Data

Mar. 30, 2020 (CN) .......................... 202010239472.8

(51) Int. Cl.
| | | |
|---|---|---|
| C08L 71/12 | (2006.01) |
| B32B 7/12 | (2006.01) |
| B32B 15/14 | (2006.01) |
| B32B 15/20 | (2006.01) |
| C09D 171/12 | (2006.01) |
| C09J 171/12 | (2006.01) |
| C08L 9/06 | (2006.01) |
| C08L 9/00 | (2006.01) |
| C09J 109/06 | (2006.01) |
| B32B 15/085 | (2006.01) |
| C08L 47/00 | (2006.01) |
| C09D 147/00 | (2006.01) |
| C09J 147/00 | (2006.01) |
| C08J 5/24 | (2006.01) |
| H05K 1/03 | (2006.01) |
| B32B 5/26 | (2006.01) |

(52) U.S. Cl.
CPC .............. *C08L 71/126* (2013.01); *B32B 7/12* (2013.01); *B32B 15/085* (2013.01); *B32B 15/14* (2013.01); *B32B 15/20* (2013.01); *C08J 5/24* (2013.01); *C08L 9/00* (2013.01); *C08L 9/06* (2013.01); *C08L 47/00* (2013.01); *C09D 147/00* (2013.01); *C09D 171/12* (2013.01); *C09J 109/06* (2013.01); *C09J 147/00* (2013.01); *C09J 171/12* (2013.01); *B32B 5/26* (2013.01); *B32B 2260/021* (2013.01); *B32B 2260/023* (2013.01); *B32B 2260/046* (2013.01); *B32B 2262/101* (2013.01); *B32B 2307/204* (2013.01); *B32B 2457/08* (2013.01); *C08L 2203/20* (2013.01); *C08L 2205/03* (2013.01); *H05K 1/0326* (2013.01)

(58) Field of Classification Search
CPC ..... C08L 71/126; C08L 93/00; C09D 171/12; C09J 171/12
See application file for complete search history.

(56) References Cited

U.S. PATENT DOCUMENTS

| 5,182,151 A * | 1/1993 | Furuta .................. C08L 71/126 |
| | | 525/905 |
| 5,223,568 A | 6/1993 | Landi et al. |
| 5,571,609 A | 11/1996 | St. Lawrence et al. |
| 8,669,309 B1 * | 3/2014 | Balfour ................... C08L 71/12 |
| | | 524/127 |
| 2002/0001720 A1 | 1/2002 | Clough |
| 2008/0038528 A1 * | 2/2008 | Paul ....................... C09J 107/00 |
| | | 428/500 |
| 2013/0180770 A1 | 7/2013 | Su |
| 2021/0368628 A1 * | 11/2021 | Devahif ................. B32B 27/26 |

FOREIGN PATENT DOCUMENTS

| CN | 109438960 A | 3/2019 |
| CN | 109852031 A | 6/2019 |
| WO | WO-9711997 A1 * | 4/1997 ............. C08L 53/00 |

(Continued)

OTHER PUBLICATIONS

Fink, Reactive Polymers Fundamentals and Applications: A Concise Guide to Industrial Polymers, Second Edition, 2013, Chapter 12. Terpene Resins, pp. 303-315. (Year: 2013).*
Collin, Resins, Synthetic, 2012, in Ullmann's Encyclopedia of Industrial Chemistry, vol. 31, pp. 496-519. (Year: 2012).*
Ruckel, The Chemistry of Tackifying Terpene Resins, 1975, Adhesion Science and Technology, Lee (ed), pp. 395-412. (Year: 1975 ).*
Mosquera, Review Terpenes and Terpenoids: Building Blocks to Produce Biopolymers, Sustainable Chemistry, 2021, vol. 2, pp. 467-492. (Year: 2021).*

(Continued)

*Primary Examiner* — Monique R Jackson
(74) *Attorney, Agent, or Firm* — Norton Rose Fulbright US LLP; James R. Crawford

(57) ABSTRACT

The present application provides a resin component, and a prepreg and a circuit material using the same. The resin component comprises unsaturated polyphenylene ether resin, polyolefin resin, terpene resin and an initiator. When the total weight of the unsaturated polyphenylene ether resin, polyolefin resin and terpene resin is defined as 100 parts by weight, the terpene resin is in an amount of 3-40 parts by weight. The polyolefin resin is one or a combination of at least two selected from the group consisting of unsaturated polybutadiene resin, SBS resin and styrene butadiene resin. The present application discloses that the resulting resin composition has good film-forming properties, adhesion and dielectric properties through the coordination of unsaturated polyphenylene ether resin, unsaturated polyphenylene ether resin, polyolefin resin and terpene resin, and the circuit boards using the same have higher interlayer peel strength and lower dielectric loss.

20 Claims, No Drawings

(56) References Cited

FOREIGN PATENT DOCUMENTS

WO     2014065048 A1    5/2014
WO     2016095437 A1    6/2016

OTHER PUBLICATIONS

European Search Report dated Jul. 7, 2021 in corresponding patent application No. 21153736.0-1107.
Terpen Resins, ROEMPP-Redaktion, RG-20-00736 (2002), Roempp Chemie-Lexikon, 1 page, with English translation, in ROMPP Online, https://roempp.thieme.de/ZW7H2, XP055819167.
Tackifier, ROEMPP-Redaktion, RD-20-00066, Roempp Chemie-Lexikon (2002), p. 1-2, with English translation, XP055819169, http://roempp.thieme.de/S1ZG6.
Office Action dated Aug. 10, 2022 by the CIPO in the corresponding Patent Application No. CN 202010239472.8, with English translation.

* cited by examiner

RESIN COMPOSITION, AND PREPREG AND CIRCUIT MATERIAL USING THE SAME

CROSS-REFERENCE TO RELATED APPLICATION(S)

The present disclosure claims priority to a Chinese Patent Application No. CN 202010239472.8, filed on Mar. 30, 2020 to the CNIPA, the contents of which are incorporated by reference herein in its entirety.

TECHNICAL FIELD

The present application belongs to the technical field of printed circuit boards, and specifically relates to a resin composition and a prepreg and circuit material using the same.

BACKGROUND

Circuit boards are key components of electronic equipment such as mobile phones, computers, communication base stations and smart robots, and have a significant impact on the speed and accuracy of information transmission. With the development of high-performance, high-functionality, and networking of communication equipment in recent years, operating signals are becoming high-frequency in order to transmit and process large-capacity information at high speeds.

The smaller the dielectric constant of the circuit insulating material is, the higher the signal transmission rate is. For high-speed signal transmission, it is thus necessary to develop a circuit substrate with a low dielectric constant. At the same time, high frequency signals will increase the dielectric loss during signal transmission, which will increase the risk of signal distortion. Therefore, it is also necessary to reduce the dielectric loss factor of the circuit substrate.

U.S. Pat. No. 5,223,568A discloses a board made of polybutadiene, polyisoprene, and a thermoplastic elastomer. U.S. Pat. No. 5,571,609A discloses a board made of unsaturated polybutadiene resin, unsaturated olefin resin and a filler. The board is not sticky and has good manufacturability. However, the board contains a large amount of fillers, and has low peel strength and high dielectric loss. Non-polar polyolefin materials are used in the above boards, and the boards have good dielectric properties. However, polyolefin materials have fewer reactive groups, resulting in weak intermolecular forces after curing. Therefore, the prepared sheets have the disadvantages of low peel strength and insufficient heat resistance. High peel strength and high heat resistance are also required for circuit substrates of high-performance communication equipment.

In addition, the traditional copper clad laminate is prepared by the method of infiltrating the resin composition with the reinforcing material. For the circuit boards obtained by bonding the adhesive film, the film forming performance of the base material needs to be considered.

Therefore, it is of great significance for the electronic information and communication industry to develop a circuit board with higher peel strength and lower dielectric loss.

SUMMARY

The present application provides a resin composition, and a prepreg and a circuit material using the same. The resin composition provided by the present application has good film-forming properties, adhesion and dielectric properties, and the circuit boards using the same have higher interlayer peel strength and lower dielectric loss.

In the first aspect, the present application provides a resin composition, which comprises unsaturated polyphenylene ether resin, polyolefin resin, terpene resin and an initiator; wherein when the total weight of the unsaturated polyphenylene ether resin, polyolefin resin and terpene resin is defined as 100 parts by weight, the terpene resin is in an amount of 3-40 parts by weight; and the polyolefin resin is one or a combination of at least two selected from the group consisting of polybutadiene resin, SBS resin and styrene butadiene resin.

In the present application, the terpene resin can react with the unsaturated polyphenylene ether resin and the polyolefin resin. Through coordination of the three, the resulting resin composition has good film-forming properties, adhesion properties and dielectric properties. The resin composition can be used as an adhesive layer material for circuit materials, or used to impregnate reinforcing materials to prepare prepregs, so that the resulting circuit boards can achieve higher interlayer peel strength and lower dielectric loss.

As the preferred technical solution of the present application, the resin composition comprises 40-80 parts by weight of unsaturated polyphenylene ether resin, 10-50 parts by weight of polyolefin resin and 3-40 parts by weight of terpene resin, when the total weight of the unsaturated polyphenylene ether resin, polyolefin resin and terpene resin is defined as 100 parts by weight.

The content of the unsaturated polyphenylene ether resin may be 40, 42, 45, 48, 50, 52, 55, 58, 60, 62, 65, 68, 70, 72, 75, 78, 80 parts by weight and etc.

The content of the polyolefin resin may be 10, 12, 15, 18, 20, 22, 25, 28, 30, 32, 35, 38, 40, 42, 45, 48 or 50 parts by weight and etc.

The content of the terpene resin can be 3, 5, 8, 10, 12, 15, 18, 20, 22, 25, 28, 30, 32, 35, 38 or 40 parts by weight and etc.

As the preferred technical solution of the present application, the unsaturated polyphenylene ether resin has the structural formula as shown in Formula (1)

Formula (1)

wherein a and b are each independently an integer of 1-30 (e.g. 1, 3, 5, 8, 10, 12, 15, 18, 20, 22, 25, 28 or 30); Z has the structure shown in Formula (2) or (3); $-(O-Y)-$ has the structure shown in Formula (4); and $-(O-X-O)-$ has the structure shown in Formula (5)

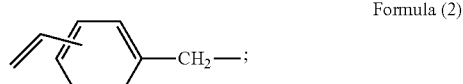

Formula (2)

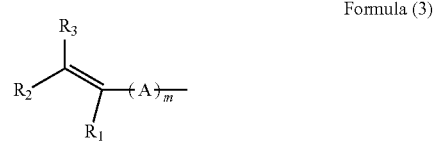

Formula (3)

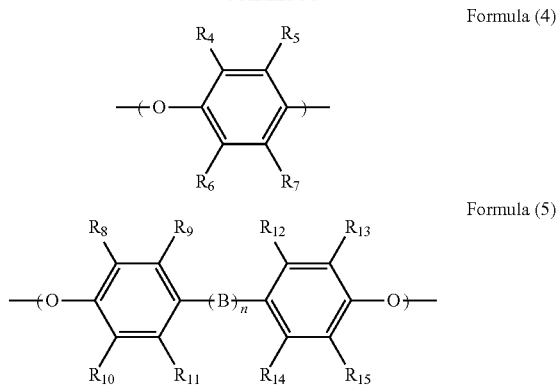

Formula (4)

Formula (5)

in Formula (3), A is any one selected from the group consisting of an arylene group, a carbonyl group and an alkylene group having 1-10 carbon atoms (e.g. 1, 2, 3, 4, 5, 6, 7, 8, 9 or 10); m is an integer of 0-10 (e.g. 0, 1, 2, 3, 4, 5, 6, 7, 8, 9 or 10); and $R_1$-$R_3$ are each independently a hydrogen atom or an alkyl group having 1-10 carbon atoms (e.g. 1, 2, 3, 4, 5, 6, 7, 8, 9 or 10);

in Formula (4), $R_4$ and $R_6$ are each independently any one selected from the group consisting of a hydrogen atom, a halogen atom, a phenyl group and an alkyl group having 1-8 carbon atoms (e.g. 1, 2, 3, 4, 5, 6, 7, or 8); and $R_5$ and $R_7$ are each independently any one selected from the group consisting of a halogen atom, a phenyl group and an alkyl group having 1-8 carbon atoms (e.g. 1, 2, 3, 4, 5, 6, 7 or 8); and in Formula (5), $R_8$-$R_{16}$ are each independently any one selected from the group consisting of a hydrogen atom, a halogen atom, a phenyl group and an alkyl group having 1-8 carbon atoms (e.g. 1, 2, 3, 4, 5, 6, 7 or 8); B is a hydrocarbylene group having 20 carbon atoms or less (e.g. 1, 2, 3, 4, 5, 6, 7, 8, 10, 12, 15, 18 or 20)

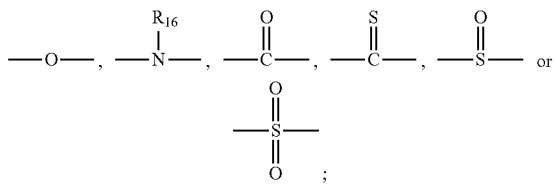

n is 0 or 1; and $R_{16}$ is a hydrogen atom or a hydrocarbon group having 1-10 carbon atoms.

As the preferred technical solution of the present application, the polyolefin resin is an unsaturated polybutadiene resin. As compared with other materials, the unsaturated polybutadiene resin can make the crosslinking density of the resin composition higher and the heat resistance better.

Preferably, the unsaturated polybutadiene resin has a number average molecular weight of 1,000-50,000, e.g. 1,000, 1,500, 2,000, 2,500, 3,000, 3,500, 4,000, 4,500, 5,000, 5,500, 6,000, 6,500, 7,000, 8,000, 9,000, 10,000, 15,000, 20,000, 25,000, 30,000, 35,000, 40,000, 45,000 or 50,000, further preferably 2,000-40,000, more preferably 3,000-30,000. If its molecular weight is too small, the adhesive film formed by the resin composition will be highly viscous and cannot be operated continuously; if its molecular weight is too large, it cannot be dissolved and it is difficult to prepare an adhesive film.

Unless otherwise specified, the number average molecular weight in the present application refers to the number average molecular weight measured by gel permeation chromatography.

Preferably, the polybutadiene resin has a vinyl content of 60-99 mol. %, e.g. 60 mol. %, 62 mol. %, 65 mol. %, 68 mol. %, 70 mol. %, 72 mol. %, 75 mol. %, 78 mol. %, 80 mol. %, 82 mol. %, 85 mol. %, 88 mol. %, 90 mol. %, 92 mol. %, 95 mol. % or 99 mol. %, further preferably 70-95 mol. %, more preferably 75-93 mol. %. If the vinyl content is less than 60%, it will render low crosslinking density and poor heat resistance of the resin composition.

It should be noted that the vinyl content of the unsaturated polybutadiene resin in the present application refers to the percentage of the molar amount of vinyl-containing units to the molar amount of all units of the unsaturated polybutadiene resin.

Preferably, the unsaturated polybutadiene resin is unsaturated polybutadiene resin modified with polar groups. Modification with polar groups is more conducive to improving the adhesion of the resin composition and increasing the peel strength of laminates and circuit materials.

Preferably, the grafting rate of the polar groups in the polar group-modified unsaturated polybutadiene resin is 5-10%.

Preferably, the polar group-modified unsaturated polybutadiene resin is one or a combination of at least two selected from the group consisting of epoxy modified unsaturated polybutadiene resin, maleic anhydride modified unsaturated polybutadiene resin, acrylic acid modified unsaturated polybutadiene resin, hydroxy-terminated unsaturated polybutadiene resin, carboxy-terminated unsaturated polybutadiene resin, and amine-modified unsaturated polybutadiene resin.

As the preferred technical solution of the present application, the terpene resin has a number average molecular weight of 400-4,000, e.g. 400, 500, 600, 700, 800, 900, 1,000, 1,200, 1,500, 1,800, 2,000, 2,200, 2,500, 2,800, 3,000, 3,200, 3,500, 3,800 or 4,000, further preferably 500-3,000, more preferably 600-2,000. If the molecular weight thereof is less than 400, the adhesive film formed by the resin composition has high viscosity, so that continuous production is difficult. If the molecular weight thereof is greater than 4000, the solubility thereof is too poor to prepare an adhesive film.

Preferably, the terpene resin comprises polymers of one or more monomers selected from the group consisting of turpentine, α-pinene, β-pinene, limonene, β-phellandrene and limonene;

Preferably, the terpene resin is one or a combination of at least two selected from the group consisting of polyterpene resins, terpene-phenol resins, styrenated terpene resins, terpene-hydrocarbon resins and terpene-vinyl aromatic compound resins.

As the preferred technical solution of the present application, preferably, the initiator is in an amount of 0.1-7 parts by weight, e.g. 0.1, 0.2, 0.5, 0.8, 1, 1.5, 2, 2.5, 3, 3.5, 4, 4.5, 5, 5.5, 6, 6.5 or 7 parts by weight, when the total weight of the unsaturated polyphenylene ether resin, polyolefin resin and terpene resin is defined as 100 parts by weight.

Preferably, the initiator is a first initiator, a second initiator, or a combination of the first initiator and the second initiator. The first initiator has the 1 min half-life temperature of 50-160° C. (e.g. 50° C., 60° C., 70° C., 80° C., 90° C., 100° C., 110° C., 120° C., 130° C., 140° C., 150° C. or 160° C.), and the second initiator has the 1 min half-life temperature of 160-300° C. (e.g. 160° C., 170° C., 180° C., 190° C., 200° C., 210° C., 220° C., 230° C., 240° C., 250° C., 260° C., 270° C., 280° C., 290° C. or 300° C.).

Preferably, the first initiator is one or a combination of at least two selected from the group consisting of tert-butyl peroxyacetate, 2,2-bis(tert-butylperoxy)octane, tert-butyl peroxyisopropyl carbonate, 1,1-bis(tert-butylperoxy)cyclohexanone, 1,1-bis(tert-butylperoxy)-3,3,5-trimethylcyclohexanone, tert-butyl peroxycaprylate, tert-butyl peroxyisobutyrate, disuccinate peroxide, di-m-toluoyl peroxide, xyloyl peroxide, diacetyl peroxide, cumyl peroxycaprylate, didecanoyl peroxide, dioctanoyl peroxide, didodecanoyl peroxide, bis(3,5,5-trimethylacetyl peroxide), tert-butyl peroxypivalate, tert-hexyl peroxytrimethyl acetate, tert-butyl peroxyneohexanoate, tert-hexyl peroxyneohexanoate, bis(3-methyl-3-methoxybutyl peroxyhydrocarbonate), tert-hexyl peroxyneodecanoate, tert-butyl peroxyneodecanoate, cumyl peroxyneohexanoate, bismethoxyisopropyl peroxyhydrocarbonate, ditetradecyl peroxyhydrocarbonate, diallyl peroxyhydrocarbonate, cumyl peroxyneodecanoate, di-n-propyl peroxyhydrocarbonate, bis(2-hydroxyethylhexyl peroxyhydrocarbonate), bis(2-ethylhexyl peroxyhydrocarbonate), di-n-butyl peroxyhydrocarbonate, diisobutyl peroxyhydrocarbonate, diisobutylene peroxide, diisopropyl peroxyhydrocarbonate and acetylcyclohexylsulfonyl peroxide.

Preferably, the second initiator is one or a combination of at least two selected from the group consisting of tert-butyl hydroperoxide, tetramethylbutane peroxide, 2,5-dimethyl-2,5-bis(tert-butylperoxy)-hexyne, di-tert-butyl peroxide, a,a-bis(tert-butylperoxy-m-cumyl), 2,5-dimethyl-2,5-bis(tert-butylperoxy)hexane, tert-butylcumyl peroxide, tert-butylperoxyallyl hydrocarbonate, dicumyl peroxide (DCP), tert-butyl peroxybenzoate, di-tert-butyl peroxyisophthalate, n-butyl-4,4-bis(tert-butylperoxy)valerate, tert-butyl peroxy (3,5,5-trimethyl acetate), tert-butyl peroxylaurate, 2,5-dimethyl-2,5-bis(dibenzoylperoxy) hexane and 2,2-bis(tert-butylperoxy)butane.

As the preferred technical solution of the present application, the resin composition further comprises a flame retardant.

Preferably, the flame retardant is in an amount of 10-40 parts by weight, e.g. 10, 12, 15, 18, 20, 22, 25, 28, 30, 32, 35, 38 or 40 parts by weight, when the total weight of the unsaturated polyphenylene ether resin, polyolefin resin and terpene resin is defined as 100 parts by weight.

Preferably, the flame retardant is one or a combination of at least two selected from the group consisting of decabromodiphenyl ether, ethyl-bis(tetrabromophthalimide), decabromodiphenylethane, tris(2,6-dimethylphenyl)phosphine, 10-(2,5-dihydroxyphenyl)-9,10-dihydro-9-oxo-10-phosphophene-10-oxide, 2,6-bis(2,6-dimethylbenzene)phosphobenzene and 10-phenyl-9,10-dihydro-9-oxo-10-phosphophene-10-oxide.

Preferably, the resin composition further comprises a silane coupling agent.

Preferably, the silane coupling agent is in an amount of 0.1-5 parts by weight, e.g. 0.1, 0.3, 0.5, 0.8, 1, 1.5, 2, 2.5, 3, 3.5, 4, 4.5 or 5 parts by weight, when the total weight of the unsaturated polyphenylene ether resin, polyolefin resin and terpene resin is defined as 100 parts by weight.

Preferably, the silane coupling agent is one or a combination of at least two selected from the group consisting of vinyl trimethoxysilane, vinyl triethoxy silane, vinyl tri-tert-butylperoxy silane, vinyl triisopropoxy silane, vinyl triacetoxy silane, vinyl trisilane, vinyl triisopropoxy silane, propenyl trimethoxy silane, vinyl tri(2-methoxyethoxy)silane, γ-methacryloxypropyltrimethoxy silane, γ-methacryloxytriisopropoxy silane, triphenoxyvinyl silane and vinyltriisopropoxy silane.

The addition of a silane coupling agent helps to further increase the adhesiveness of the resin composition and improve the peel strength of the circuit laminates.

Preferably, the resin composition further comprises a filler.

Preferably, the filler is in an amount of 20-90% of the total weight of the resin composition, e.g. 20%, 25%, 30%, 35%, 40%, 45%, 50%, 55%, 60%, 65%, 70%, 75%, 80%, 85% or 90%.

Preferably, the filler is one or a combination of at least two selected from the group consisting of crystalline silica, amorphous silica, spherical silica, angular silica, hollow microspheres, titanium dioxide, boron nitride, aluminum nitride, silicon carbide, alumina, barium titanate, strontium titanate, magnesium titanate, calcium titanate, barium strontium titanate, barium calcium titanate, lead titanate, lead zirconate titanate, lead lanthanum zirconate titanate, barium lanthanum titanate, barium zirconium titanate, hafnium dioxide, lead magnesium niobate, barium magnesium niobate, lithium niobate, aluminum strontium tantalate, potassium tantalum niobate, barium strontium niobate, lead barium niobate, barium titanium niobate, strontium bismuth tantalate, bismuth titanate, barium rubidium titanate, copper titanate and lead titanate-lead magnesium niobite.

Preferably, the filler has a median particle size of 0.5-20 μm, e.g. 0.5 μm, 1 μm, 3 μm, 5 μm, 8 μm, 10 μm, 12 μm, 15 μm, 18 μm or 20 μm, further preferably 1-15 μm, more preferably 4-10 μm.

Unless otherwise specified, the median particle size in the present application refers to the median particle size measured by a laser particle size analyzer.

In the second aspect, the present application provides a prepreg comprising a reinforcing material, and the resin composition according to the first aspect attached to the reinforcing material after being impregnated and dried.

In the third aspect, the present application provides a resin film prepared by baking and heating followed by semi-curing the resin composition in the first aspect. Specifically, the resin film can be obtained by coating the resin composition described in the first aspect on a release material; baking, heating and semi-curing; and then removing the release material.

In the fourth aspect, the present application provides a resin-coated copper foil formed by coating the resin composition in the first aspect on a copper foil, baking and heating, and then semi-curing.

In the fifth aspect, the present application provides a laminate comprising one or at least two stacked prepregs in the second aspect.

In the sixth aspect, the present application provides a circuit material comprising a conductive metal layer and a dielectric substrate layer, and an adhesive layer arranged between the conductive metal layer and the dielectric substrate layer, wherein the adhesive layer is obtained by applying the resin composition in the first aspect dissolved in a solvent to the surface of the conductive metal layer or the dielectric substrate layer in the form of a solution, or applying to a release material and removing the release material after partially curing or completely curing.

Preferably, the conductive metal layer is copper foil.

Preferably, the surface roughness of the copper foil is less than 2 µm, e.g. may be 2 µm, 1.8 µm, 1.6 µm, 1.5 µm, 1.3 µm, 1.2 µm, 1 µm, 0.8 µm, 0.7 µm, 0.5 µm, 0.4 µm, 0.3 µm or 0.2 µm, further preferably less than 0.7 µm.

In the seventh aspect, the present application provides a multilayer circuit comprising the laminate in the fifth aspect or the circuit material in the sixth aspect.

As compared with the prior art, the present application has the following beneficial effects.

The present application discloses that, through the coordination among the unsaturated polyphenylene ether resin, the polyolefin resin and terpene resin, the resulting resin composition has good film-forming properties, adhesion properties and dielectric properties. The resin composition can be used as an adhesive layer material for circuit materials, or used to impregnate reinforcing materials to prepare prepregs, so that the resulting circuit boards can achieve higher interlayer peel strength and lower dielectric loss and meet the performance requirements of high-frequency plates.

DETAILED DESCRIPTION

The technical solutions of the present application will be further illustrated by specific embodiments below. Those skilled in the art should understand that the described embodiments are only to help understand the present application and should not be regarded as specific limitations to the present application.

The sources of raw materials used in the embodiments of the present application are listed as follows:

Unsaturated Polyphenylene Ether Resin:
Polyphenylene ether resin MMA-PPE (SA9000, SABIC);
Polyphenylene ether resin St-PPE-2 (manufactured by Mitsubishi Chemical Corporation);
Polyphenylene ether resin St-PPE-1 (manufactured by Mitsubishi Chemical Corporation).
Unsaturated Polybutadiene Resin:
B1000: Nippon Soda Corporation;
B3000: Nippon Soda Corporation;
R810: Japan JSR Corporation.
Sbs Resin:
D1118: Kraton Polymers;
Terpene Resin:
KT90, Guangdong KOMO Co., Ltd
KT100, Guangdong KOMO Co., Ltd
KT5090 Guangdong KOMO Co., Ltd
Terpene Solvents:
GP00007 (α-Pinene monomer), Fujian Green Pine Co., Ltd.
Initiator:
BPO: Dahe Oil & Fat Co., Ltd.;
DCP: Shanghai Fangruida Chemical.

Examples 1-3 and Comparative Examples 1-6

Examples 1-3 and Comparative Examples 1-6 each provided a circuit material, and the preparation method is as follows.

Prepreg: Synamic6 prepreg, a thermosetting hydrocarbon-based substrate material, made by Shengyi Technology, Guangdong, China.

Preparation of adhesive layer: Unsaturated polyphenylene ether resin, polyolefin resin, terpene resin, initiator, flame retardant and filler were dissolved in xylene and mixed at room temperature to obtain a glue. The glue was coated onto a copper foil by using a coating machine, and then baked in an oven at 155° C. for 5 minutes to obtain a copper foil with an adhesive layer (the grammage of the adhesive layer was 20 g/m$^2$).

Preparation of Circuit Materials:

4 Synamic6 prepregs and the copper foil with an adhesive layer were stacked neatly (the adhesive layer was between the prepreg and the copper foil), laminated and cured in a press at 210° C. to obtain a circuit material.

Example 4

This example provided a copper clad laminate, and the preparation method is as follows.

Unsaturated polyphenylene ether resin, polyolefin resin, terpene resin, initiator, flame retardant and filler, etc. were dissolved in xylene in proportions, and mixed at room temperature to obtain a glue. The reinforcing material 2116 glass fiber was impregnated with the glue, dried and semi-cured to obtain a prepreg.

The above-mentioned prepreg and a piece of copper foil were stacked neatly, laminated and cured in a press at 210° C. to obtain a copper-clad laminate.

Example 5

This example provided a circuit material, and the preparation method is as follows.

Prepreg: S7136 prepreg, a thermosetting hydrocarbon-based substrate material, made by Shengyi Technology, Guangdong, China.

Preparation of adhesive layer: Unsaturated polyphenylene ether resin, polyolefin resin, terpene resin, initiator, flame retardant and filler were dissolved in xylene and mixed at room temperature to obtain a glue. The glue was coated onto a copper foil by using a coating machine, and then baked in an oven at 155° C. for 5 minutes to obtain a copper foil with an adhesive layer (the grammage of the adhesive layer was 20 g/m$^2$).

Preparation of Circuit Materials:

4 S7136 prepregs and the copper foil with an adhesive layer were stacked neatly in order, laminated and cured in a press at 210° C. to obtain a circuit material.

Comparative Example 7

A circuit material was provided. The difference from Example 1 is that the terpene resin, which is the raw material of the resin composition, was replaced with a terpene solvent.

The types and amounts of the raw materials in Examples 1-5 and Comparative Examples 1-7 above are shown in Tables 1 and 2 below.

The dielectric constant, dielectric loss factor, peel strength and float soldering resistance of the copper clad laminates and circuit materials provided in Examples 1-5 and Comparative Examples 1-7 above were tested by the following methods.

(1) Dielectric constant (Dk) and dielectric loss factor (Df): tested in accordance with SPDR method in A state at 10 GHz;

(2) Peel strength: tested according to IPC-TM-650, 2.4.8 method;

(3) Float soldering resistance: tested in accordance with IPC-TM-650 method.

The results of the above test are shown in Tables 1 and 2.

TABLE 1

| Items | | | Example 1 | Example 2 | Example 3 | Example 4 | Example 5 | Comp. Example 1 |
|---|---|---|---|---|---|---|---|---|
| Resin composition | Polyolefin resin | Type | B1000 | B3000 | R810 | R810 | D1118 | B1000 |
| | | Amount/g | 50 | 10 | 10 | 32 | 50 | 50 |
| | terpene resin | Type | KT100 | KT90 | KT5090 | KT5090 | KT100 | KT100 |
| | | Amount/g | 10 | 10 | 40 | 3 | 10 | 25 |
| | PPO resin | Type | SA9000 | St-PPE-2 | St-PPE-1 | St-PPE-1 | SA9000 | SA9000 |
| | | Amount/g | 40 | 80 | 50 | 65 | 40 | 25 |
| | Initiator | Type | BPO | DCP | DCP | DCP | BPO | BPO |
| | | Amount/g | 0.1 | 7 | 6 | 6 | 0.1 | 0.1 |
| Performance | Dk(10 GHz) | | 3.40 | 3.63 | 3.67 | 3.53 | 3.35 | 3.43 |
| | Df(10 GHz) | | 0.0030 | 0.0037 | 0.0033 | 0.0032 | 0.0029 | 0.0029 |
| | Peel strength (N/mm) | | 1.09 | 1.37 | 1.33 | 1.24 | 1.04 | 0.71 |
| | Float soldering resistance 288° C., No layering, no foaming | | Higher than 5 min | Higher than 5 min | Higher than 5 min | Higher than 5 min | Higher than 5 min | Higher than 5 min |

TABLE 2

| Items | | | Comp. Example 2 | Comp. Example 3 | Comp. Example 4 | Comp. Example 5 | Comp. Example 6 | Comp. Example 7 |
|---|---|---|---|---|---|---|---|---|
| Resin composition | Polyolefin resin | Type | B3000 | R810 | R810 | R810 | B1000 | B1000 |
| | | Amount/g | 10 | 32 | 10 | 5 | 57 | 50 |
| | terpene resin | Type | KT90 | KT5090 | KT5090 | KT5090 | KT100 | GP00007 |
| | | Amount/g | 3 | 1 | 50 | 40 | 3 | 10 |
| | PPO resin | Type | St-PPE-2 | St-PPE-1 | St-PPE-1 | St-PPE-1 | SA9000 | SA9000 |
| | | Amount/g | 87 | 67 | 40 | 55 | 40 | 40 |
| | Initiator | Type | DCP | DCP | DCP | DCP | BPO | BPO |
| | | Amount/g | 7 | 6 | 6 | 6 | 0.1 | 0.1 |
| Performance | Dk(10 GHz) | | — | 3.53 | — | 3.69 | 3.37 | 3.39 |
| | Df(10 GHz) | | — | 0.0032 | — | 0.0039 | 0.0030 | 0.0028 |
| | Peel strength (N/mm) | | — | 0.75 | — | 1.36 | 0.71 | 0.71 |
| | Float soldering resistance 288° C., No layering, no foaming | | — | Higher than 5 min | — | Higher than 5 min | Higher than 5min | Less than 10 s |

It can be seen from the test results in Tables 1 and 2 that the copper clad laminates and circuit materials provided by the examples of the present application have the peel strength reaching 1.04-1.37 N/mm, the dielectric constant (10 GHz) of 3.35 to 3.67, and the dielectric loss factor (10 GHz) of 0.0029-0.0037, and have good dielectric properties, peel strength and float soldering resistance.

The content of the unsaturated PPO resin used in Comparative Example 1 was less than 40 wt. %. As compared with Example 1, the peel strength of the obtained sheets was reduced to only 0.71 N/mm.

The content of the unsaturated PPO resin used in Comparative Example 2 was greater than 80 wt. %. As compared with Example 2, the glue solution has poor film-forming properties, and no qualified glue film could be prepared.

In Comparative Example 3, the content of terpene resin used was less than 3 wt. %. As compared with Example 4, the peel strength of the obtained sheets was reduced to only 0.75 N/mm.

In Comparative Example 4, the content of terpene resin used was greater than 40 wt. %. As compared with Example 3, the glue solution has poor film-forming properties, and no qualified glue film could be prepared.

In Comparative Example 5, the content of polyolefin resin used was less than 10 wt. %. As compared with Example 3, the sheets had high dielectric loss, and the dielectric properties became worse.

The content of polyolefin resin used in Comparative Example 6 was greater than 50 wt. %. As compared with Example 1, the peel strength of the obtained sheets was reduced to only 0.71 N/mm.

As Compared with Example 1, the terpene solvent was used to replace the terpene resin in Comparative Example 7. The peel strength of the sheets was reduced to only 0.71 N/mm. The float soldering was less than 10 s, and the heat resistance was reduced.

The applicant declares that the above descriptions are only specific implementations of the present application, but the protection scope of the present application is not limited thereto. Those skilled in the art should understand that any changes or replacements that can be easily conceived by those skilled in the art within the technical scope of the present application fall within the protection scope and disclosure of the present application.

What is claimed is:

1. A resin composition, comprising unsaturated polyphenylene ether resin, polyolefin resin, terpene resin and an initiator, wherein
when the total weight of the unsaturated polyphenylene ether resin, polyolefin resin and terpene resin is defined as 100 parts by weight, the terpene resin is in an amount of 3-40 parts by weight; and the polyolefin resin is one or a combination of at least two selected from the group consisting of unsaturated polybutadiene resin, SBS resin and styrene butadiene resin;

wherein when the total weight of the unsaturated polyphenylene ether resin, polyolefin resin and terpene resin is defined as 100 parts by weight, the resin composition comprises 40-80 parts by weight of unsaturated polyphenylene ether resin, 10-50 parts by weight of polyolefin resin, 3-40 parts by weight of terpene resin and 0.1-7 parts by weight of an initiator.

2. The resin composition according to claim 1, wherein the unsaturated polyphenylene ether resin has the structural formula as shown in Formula (1):

Formula (1)

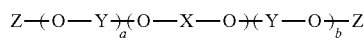

wherein a and b are each independently an integer of 1-30; Z has the structure shown in Formula (2) or (3); $-(O-Y-)$ has the structure shown in Formula (4); and $-(O-X-O-)$ has the structure shown in Formula (5)

Formula (2)

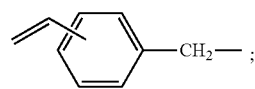

Formula (3)

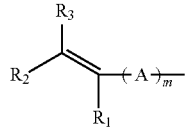

Formula (4)

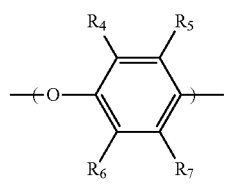

Formula (5)

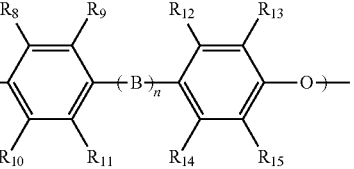

in Formula (3), A is any one selected from the group consisting of an arylene group, a carbonyl group and an alkylene group having 1-10 carbon atoms; m is an integer of 0-10; and $R_1$-$R_3$ are each independently a hydrogen atom or an alkyl group having 1-10 carbon atoms;

in Formula (4), $R_4$ and $R_6$ are each independently any one selected from the group consisting of a hydrogen atom, a halogen atom, a phenyl group and an alkyl group having 1-8 carbon atoms; and $R_5$ and $R_7$ are each independently any one selected from the group consisting of a halogen atom, a phenyl group and an alkyl group having 1-8 carbon atoms; and in Formula (5), $R_8$-$R_{15}$ are each independently any one selected from the group consisting of a hydrogen atom, a halogen atom, a phenyl group and an alkyl group having 1-8 carbon atoms; B is a hydrocarbylene group having 20 carbon atoms or less,

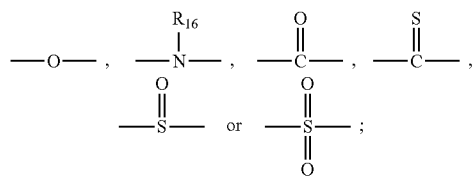

n is 0 or 1; and $R_{16}$ is a hydrogen atom or a hydrocarbon group having 1-10 carbon atoms.

3. The resin composition according to claim 1, wherein the polyolefin resin is unsaturated polybutadiene resin.

4. The resin composition according to claim 3, wherein the unsaturated polybutadiene resin has a number average molecular weight of 1,000-50,000.

5. The resin composition according to claim 3, wherein the unsaturated polybutadiene resin has a vinyl content of 60-99 mol. %.

6. The resin composition according to claim 5, wherein the unsaturated polybutadiene resin has a vinyl content of 75-93 mol. %.

7. The resin composition according to claim 3, wherein the unsaturated polybutadiene resin is unsaturated polybutadiene resin modified with polar groups; wherein the unsaturated polybutadiene resin modified with polar groups has a grafting rate of polar groups of 5-10%.

8. The resin composition according to claim 7, wherein the unsaturated polybutadiene resin modified with polar groups is one or a combination of at least two selected from the group consisting of epoxy modified unsaturated polybutadiene resin, maleic anhydride modified unsaturated polybutadiene resin, acrylic acid modified unsaturated polybutadiene resin, hydroxy-terminated unsaturated polybutadiene resin, carboxy-terminated unsaturated polybutadiene resin, and amine-modified unsaturated polybutadiene resin.

9. The resin composition according to claim 1, wherein the terpene resin has a number average molecular weight of 400-4,000.

10. The resin composition according to claim 1, wherein the terpene resin comprises at least one member selected from the group consisting of turpentine, α-pinene, β-pinene, limonene and β-phellandrene.

11. The resin composition according to claim 1, wherein the terpene resin is one or a combination of at least two selected from the group consisting of polyterpene resins, terpene-phenol resins, styrenated terpene resins, terpene-hydrocarbon resins and terpene-vinyl aromatic compound resins.

12. The resin composition according to claim 1, wherein the terpene resin comprises a polymer.

13. The resin composition according to claim 1, wherein the initiator is a first initiator, a second initiator, or a combination of the first initiator and the second initiator; wherein the first initiator has a 1 min half-life temperature of 50-160° C., and the second initiator has a 1 min half-life temperature of 160-300° C.

14. The resin composition according to claim 13, wherein the first initiator is one or a combination of at least two selected from the group consisting of tert-butyl peroxyacetate, 2,2-bis(tert-butylperoxy)octane, tert-butyl peroxyisopropyl carbonate, 1,1-bis(tert-butylperoxy)cyclohexanone, 1,1-bis(tert-butylperoxy)-3,3,5-trimethylcyclohexanone, tert-butyl peroxycaprylate, tert-butyl peroxyisobutyrate, disuccinate peroxide, di-m-toluoyl peroxide, xyloyl peroxide, diacetyl peroxide, cumyl peroxycaprylate, didecanoyl peroxide, dioctanoyl peroxide, didodecanoyl peroxide, bis(3,5,5-trimethylacetyl peroxide), tert-butyl peroxypivalate, tert-hexyl peroxytrimethyl acetate, tert-butyl peroxyneohexanoate, tert-hexyl peroxyneohexanoate, bis(3-methyl-3-methoxybutyl peroxyhydrocarbonate), tert-hexyl peroxyneodecanoate, tert-butyl peroxyneodecanoate, cumyl peroxyneohexanoate, bismethoxyisopropyl peroxyhydrocarbonate, ditetradecyl peroxyhydrocarbonate, diallyl peroxyhydrocarbonate, cumyl peroxyneodecanoate, di-n-propyl peroxyhydrocarbonate, bis(2-hydroxyethylhexyl peroxyhydrocarbonate), bis(2-ethylhexyl peroxyhydrocarbonate), di-n-butyl peroxyhydrocarbonate, diisobutyl peroxyhydrocarbonate, diisobutylene peroxide, diisopropyl peroxyhydrocarbonate and acetylcyclohexylsulfonyl peroxide; and wherein the second initiator is one or a combination of at least two selected from the group consisting of tert-butyl hydroperoxide, tetramethylbutane peroxide, 2,5-dimethyl-2,5-bis(tert-butylperoxy)-hexyne, di-tert-butyl peroxide, a,a-bis(tert-butylperoxy-m-cumyl), 2,5-dimethyl-2,5-bis(tert-butylperoxy)hexane, tert-butylcumyl peroxide, tert-butylperoxyallyl hydrocarbonate, dicumyl peroxide (DCP), tert-butyl peroxybenzoate, di-tert-butyl peroxyisophthalate, n-butyl-4,4-bis(tert-butylperoxy)valerate, tert-butyl peroxy(3,5,5-trimethyl acetate), tert-butyl peroxylaurate, 2,5-dimethyl-2,5-bis(dibenzoylperoxy)hexane and 2,2-bis(tert-butylperoxy)butane.

15. The resin composition according to claim 1, wherein the resin composition further comprises a flame retardant; wherein the flame retardant is in an amount of 10-40 parts by weight, when the total weight of the unsaturated polyphenylene ether resin, polyolefin resin and terpene resin is defined as 100 parts by weight.

16. The resin composition according to claim 1, wherein the resin composition further comprises a silane coupling agent; wherein the silane coupling agent is in an amount of 0.1-5 parts by weight, when the total weight of the unsaturated polyphenylene ether resin, polyolefin resin and terpene resin is defined as 100 parts by weight.

17. The resin composition according to claim 1, wherein the resin composition further comprises a filler, wherein the filler is in an amount of 20-90% of the total weight of the resin composition.

18. A resin-coated copper foil, which is formed by coating the resin composition of claim 1 on a copper foil, baking and heating, and then semi-curing.

19. A laminate, comprising one or at least two stacked prepregs, wherein the prepreg comprising a reinforcing material, and the resin composition according to claim 1 which is attached to the reinforcing material after being impregnated and dried.

20. A circuit material, comprising a conductive metal layer and a dielectric substrate layer, and an adhesive layer arranged between the conductive metal layer and the dielectric substrate layer, wherein the adhesive layer is obtained by applying the adhesive composition of claim 1 dissolved in a solvent to the surface of the conductive metal layer or the dielectric substrate layer in the form of a solution, or applying to a release material and removing the release material after partially curing or completely curing.

* * * * *